US011990909B2

United States Patent
Kong et al.

(10) Patent No.: US 11,990,909 B2
(45) Date of Patent: May 21, 2024

(54) LOW POWER RETENTION FLIP-FLOP (71) Applicant: SK keyfoundry Inc., Cheongju-si (KR)

(72) Inventors: Wanchul Kong, Gwangju-si (KR);
Keesik Ahn, Hwaseong-si (KR)

(73) Assignee: SK keyfoundry Inc., Cheongju-si (KR)

( * ) Notice: Subject to any disclaimer, the term of this patent is extended or adjusted under 35 U.S.C. 154(b) by 0 days.

(21) Appl. No.: 17/690,090

(22) Filed: Mar. 9, 2022

(65) Prior Publication Data
US 2023/0050338 A1 Feb. 16, 2023

(30) Foreign Application Priority Data

Aug. 5, 2021 (KR) .................. 10-2021-0102863

(51) Int. Cl.
*H03K 3/037* (2006.01)
*H03K 3/012* (2006.01)
*H03K 19/20* (2006.01)

(52) U.S. Cl.
CPC ........... *H03K 3/0372* (2013.01); *H03K 3/012* (2013.01); *H03K 19/20* (2013.01)

(58) Field of Classification Search
CPC ............................. H03K 3/0372; H03K 3/012
See application file for complete search history.

(56) References Cited

U.S. PATENT DOCUMENTS

| 7,590,906 | B2 | 9/2009 | Miwa | |
| 8,242,826 | B2* | 8/2012 | Chi | H03K 3/356156 |
| | | | | 327/203 |
| 2006/0220700 | A1* | 10/2006 | Hoover | H03K 3/012 |
| | | | | 327/108 |
| 2008/0238510 | A1* | 10/2008 | Aksamit | H03K 3/0375 |
| | | | | 327/198 |
| 2009/0066386 | A1 | 3/2009 | Lee | |

(Continued)

FOREIGN PATENT DOCUMENTS

| JP | 2007-187458 A | 7/2007 |
| KR | 10-2009-0027042 A | 3/2009 |
| KR | 10-2009-0040519 A | 4/2009 |

OTHER PUBLICATIONS

Korean Office Action dated Dec. 10, 2022, in counterpart Korean Patent Application No. 10-2021-0102863 (7 Pages in Korean).

(Continued)

*Primary Examiner* — Sibin Chen
(74) *Attorney, Agent, or Firm* — NSIP Law (57) ABSTRACT

A retention flip-flop includes a master latch outputting a first signal which is generated based on a signal inputted through an input terminal based on first control signals; a slave latch outputting a second signal generated based on the first signal based on the first control signals and second control signals; and a control logic that generates the first control signals based on a clock signal and provides the first control signals to the master latch and the slave latch, and generates the second control signals based on a power down signal and provides the second control signals to the slave latch. The slave latch comprises a retention latch which transmits the first signal to an output terminal as the second signal by operating as an open loop based on the second control signals or maintains the second signal by forming a closed loop based on the second control signals.

18 Claims, 6 Drawing Sheets

(56) References Cited

U.S. PATENT DOCUMENTS

2011/0248759 A1* 10/2011 Chi .................. H03K 3/356008
                                                                327/202
2020/0212896 A1*  7/2020 Purushothaman ..........................
                                                                 H03K 3/35625
2020/0341537 A1* 10/2020 Samson .................... G06F 1/28

OTHER PUBLICATIONS

Korean Office Action dated May 8, 2023, in counterpart Korean Patent Application No. 10-2021-0102863 (6 pages in Korean).

* cited by examiner

LOW POWER RETENTION FLIP-FLOP

CROSS-REFERENCE TO RELATED APPLICATIONS

This application claims the benefit under 35 USC § 119(a) of Korean Patent Application No. 10-2021-0102863, filed on Aug. 5, 2021, in the Korean Intellectual Property Office, the entire disclosure of which is incorporated herein by reference for all purposes.

BACKGROUND

1. Field

The following description relates to a circuit structure of a low power retention flip-flop.

2. Description of Related Art

In a general digital circuit and/or system on chip (SoC), power may be continuously supplied even in an idle mode and/or in a sleep mode, and leak current, which leaks to the ground throughout the entire circuit block, may be generated. Accordingly, as the number of gates of a standard cell within the digital circuit and/or SoC increases, a large amount of power may be consumed even in the idle mode and/or in the sleep mode. Therefore, in order to reduce power consumption due to the current which leaks during the idle mode and/or the sleep mode, a method is provided, which temporarily cuts off the power to at least some circuit blocks.

A flip-flop (F/F) is a representative sequential logic circuit which stores and maintains one-bit information, and enables data synchronization. The F/F is a structurally volatile storage device. Power must be supplied continuously in order that the F/F may maintain and store continuously a previous state of data.

Since the flip-flop is a volatile storage device, all of the data may be lost when the power supply is cut off. Accordingly, when the power supply to the flip-flop is temporarily cut off during the idle and/or sleep modes in order to reduce power consumption, a problem may occur wherein previously received data cannot be normally restored even if the power supply is resumed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a retention flip-flop includes a master latch configured to output a first signal which is generated based on a signal inputted through an input terminal of the master latch based on first control signals; a slave latch configured to output a second signal which is generated based on the first signal inputted from the master latch based on the first control signals and second control signals; and a control logic configured to generate the first control signals based on a clock signal and provide the generated first control signals to the master latch and the slave latch, and configured to generate the second control signals based on a power down signal and provide the generated second control signals to the slave latch, wherein the slave latch comprises a retention latch configured to transmit the first signal to an output terminal as the second signal by operating as an open loop based on the second control signals or maintain the second signal by forming a closed loop based on the second control signals.

The slave latch may further include first circuit elements which may be configured to transmit the first signal inputted from the master latch to the retention latch based on the first control signals during a normal operation mode, and may be configured to be powered off during a power down mode, and wherein the retention latch may be configured to operate as the open loop based on the second control signals and output the first signal inputted from the first circuit elements to the output terminal during the normal operation mode, and form the closed loop based on the second control signals and maintain the second signal outputted to the output terminal before switching to the power down mode during the power down mode.

The master latch and the first circuit elements in the slave latch may be configured to be powered off during the power down mode, and the retention latch may be configured to maintain a power-on state during the power down mode.

The retention flip-flop may further include a first power terminal configured to supply or cut off power based on the power down mode; and a second power terminal configured to always supply power regardless of the power down mode, wherein the first power terminal may be connected to the master latch, the first circuit elements in the slave latch, and second circuit elements related to the first control signals in the control logic, and wherein the second power terminal may be connected to the retention latch and third circuit elements related to the second control signals in the control logic.

The control logic may include an inverter configured to invert the power down signal and output an inverted power down signal, and the second control signals may include the power down signal and the inverted power down signal.

The inverter may be configured to maintain a power-on state during the power down mode.

The first circuit elements may include a first transfer gate which may be connected between an output terminal of the master latch and a first node, the first transfer gate may include an NMOS transistor and a PMOS transistor, and may be configured to output the first signal inputted from the master latch to the first node based on the first control signals; a first inverter which may be connected between the first node and a second node, and may be configured to invert a signal of the first node, and output a first inverted signal to the second node; a second inverter configured to invert the first inverted signal of the second node, and output a second inverted signal; and a second transfer gate which may be connected between the second inverter and the first node, the second transfer gate may include an NMOS transistor and a PMOS transistor, and configured to output the second inverted signal to the first node based on the first control signals, and wherein the retention latch may be connected between the second node and the output terminal of the slave latch.

The retention latch may include a third transfer gate which may be connected between the second node and a third node, the third transfer gate may include an NMOS transistor and a PMOS transistor, and may be configured to output the first inverted signal of the second node to the third node based on the second control signals; a third inverter which may be connected between the third node and a fourth node, and may be configured to invert a signal of the third node, and output a third inverted signal to the fourth node;

a fourth inverter configured to invert the third inverted signal of the fourth node, and output a fourth inverted signal; and a fourth transfer gate which is connected between the fourth inverter and the third node, the fourth transfer gate may include an NMOS transistor and a PMOS transistor, and configured to output the fourth inverted signal of the fourth inverter to the third node based on the second control signals.

The control logic may be configured to receive a reset signal, and output the received reset signal to the master latch and the slave latch, respectively, and wherein each of the master latch and the slave latch may include a NAND gate which is configured to perform a negative OR operation on the reset signal and a signal of a node within each of the latches, and set an initial state value based on the reset signal.

The control logic may be configured to receive a set signal and output the set signal to the master latch and the slave latch, respectively, and each of the master latch and the slave latch may include a NAND gate which is configured to perform a negative OR operation on the set signal and a signal of a node within each of the latches, and set an initial state value based on the set signal.

In a general aspect, a retention flip-flop includes a first power terminal configured to supply or cut off power based on a power down mode; a second power terminal configured to always supply power regardless of the power down mode; a master latch which is connected to the first power terminal, and is configured to output a first signal which is generated based on a signal inputted through an input terminal of the master latch based on first control signals; a slave latch which is connected to the first power terminal and the second power terminal, and is configured to output a second signal which is generated based on the first signal inputted from the master latch based on the first control signals and second control signals; and a control logic which is connected to the first power terminal and the second power terminal, and is configured to generate the first control signals based on a clock signal, and provide the generated first control signals to the master latch and the slave latch, and generate the second control signals based on a power down signal and provide the generated second control signals to the slave latch, wherein the slave latch comprises a retention latch which is connected to the second power terminal and is configured to operate as any one of an open loop or a closed loop based on the second control signals.

The slave latch may further include first circuit elements which may be connected to the first power terminal, and may be configured to transmit the first signal inputted from the master latch to the retention latch based on the first control signals during a normal operation mode, and are configured to be powered off during the power down mode, and wherein the retention latch may be connected to the second power terminal, and may be configured to output the first signal inputted from the first circuit elements to an output terminal by operating as the open loop based on the second control signals during the normal operation mode, and maintain the first signal inputted from the first circuit elements before switching to the power down mode by forming the closed loop based on the second control signals during the power down mode.

The master latch and the first circuit elements in the slave latch may be configured to be powered off during the power down mode, and the retention latch may be configured to maintain a power-on state during the power down mode.

Circuit elements related to the first control signals in the control logic may be connected to the first power terminal, and circuit elements related to the second control signals in the control logic may be connected to the second power terminal.

The control logic may include an inverter which may be connected to the second power terminal, the inverter may be configured to invert the power down signal, and output an inverted power down signal, and the second control signals may include the power down signal and the inverted power down signal.

The first circuit elements may include a first transfer gate which may be connected between an output terminal of the master latch and a first node, the first transfer gate may include an NMOS transistor and a PMOS transistor, and may be configured to output the first signal inputted from the master latch to the first node based on the first control signals; a first inverter which may be connected between the first node and a second node, and may be configured to invert a signal of the first node, and output a first inverted signal to the second node; a second inverter configured to invert the first inverted signal of the second node and output a second inverted signal; and a second transfer gate which may be connected between the second inverter and the first node, the second transfer gate comprises an NMOS transistor and a PMOS transistor, and may be configured to output the second inverted signal to the first node based on the first control signals, and the retention latch may be connected between the second node and the output terminal of the slave latch.

The retention latch may include a third transfer gate which may be connected between the second node and a third node, the third transfer gate may include an NMOS transistor and a PMOS transistor, and may be configured to output the first inverted signal of the second node to the third node based on the second control signals; a third inverter which may be connected between the third node and a fourth node, and may be configured to invert a signal of the third node, and output a third inverted signal to the fourth node; a fourth inverter configured to invert the third inverted signal of the fourth node and output a fourth inverted the signal; and a fourth transfer gate which may be connected between the fourth inverter and the third node, the fourth transfer gate may include an NMOS transistor and a PMOS transistor, and may be configured to output the fourth inverted signal of the fourth inverter to the third node based on the second control signals.

The control logic may be configured to receive a reset signal and output the received reset signal to the master latch and the slave latch, respectively, and each of the master latch and the slave latch may include a NAND gate which may be configured to perform a negative OR operation on the reset signal and a signal of a node within each of the latches, and may set an initial state value based on the reset signal.

The control logic may be configured to receive a set signal and output the set signal to the master latch and the slave latch, respectively, and wherein each of the master latch and the slave latch may include a NAND gate which may be configured to perform a negative OR operation on the set signal a signal of a node within each of the latches, and sets an initial state value based on the set signal.

In a general aspect, a flip-flip includes a master latch configured to receive power from a first power source during a normal operation mode; a slave latch configured to receive power from the first power source and a second power source; a retention latch, disposed in the slave latch, and configured to receive power from the second power source, operate in an open loop during the normal operation mode, and operate in a closed loop to store data during a power-down mode; and a control logic configured to provide first control signals and second control signals to control circuit elements in the master latch and the slave latch.

The retention latch may be configured to operate in an always-on state.

The control logic may be configured to generate the first control signals based on a clock signal and provide the generated first control signals to the master latch and the slave latch, and may be configured to generate the second control signals based on a power down signal and provide the generated second control signals to the slave latch.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. Likewise, expressions, for example, "between" and "immediately between" and "adjacent to" and "immediately adjacent to" may also be construed as described in the foregoing.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

A term "part" or "module" used in the embodiments may mean software components or hardware components such as a field programmable gate array (FPGA), an application specific integrated circuit (ASIC). The "part" or "module" performs certain functions. However, the "part" or "module" is not meant to be limited to software or hardware. The "part" or "module" may be configured to be placed in an addressable storage medium or to restore one or more processors. Thus, for one example, the "part" or "module" may include components such as software components, object-oriented software components, class components, and task components, and may include processes, functions, attributes, procedures, subroutines, segments of a program code, drivers, firmware, microcode, circuits, data, databases, data structures, tables, arrays, and variables. Components and functions provided in the "part" or "module" may be combined with a smaller number of components and "parts" or "modules" or may be further divided into additional components and "parts" or "modules".

Methods or algorithm steps described relative to some examples may be directly implemented by hardware and software modules that are executed by one or more processors or may be directly implemented by a combination thereof. The software module may be resident on a RAM, a flash memory, a ROM, an EPROM, an EEPROM, a resistor, a hard disk, a removable disk, a CD-ROM, or any other type of record medium known to those skilled in the art.

One or more examples disclose a low-power retention flip-flop which holds data during a power down mode in which the power supply is cut off to at least some circuits.

In one or more examples, the retention latch that forms a closed loop during the power down mode may be added to the output terminal of the slave latch of a typical Data flip-flop (D flip-flop), thereby implementing the low-power retention flip-flop which performs a normal flip-flop function in the normal mode, and may form a closed loop in the power down mode, so that the data is held without loss.

Additionally, only a buffer related to the power down signal and the retention latch may be added to the low-power retention flip-flop according to one or more examples. As a result, the low-power retention flip-flop may be implemented without significantly changing the structure of an existing flip-flop circuit. Accordingly, a chip size may be smaller and power consumption may be reduced.

Figure 1:
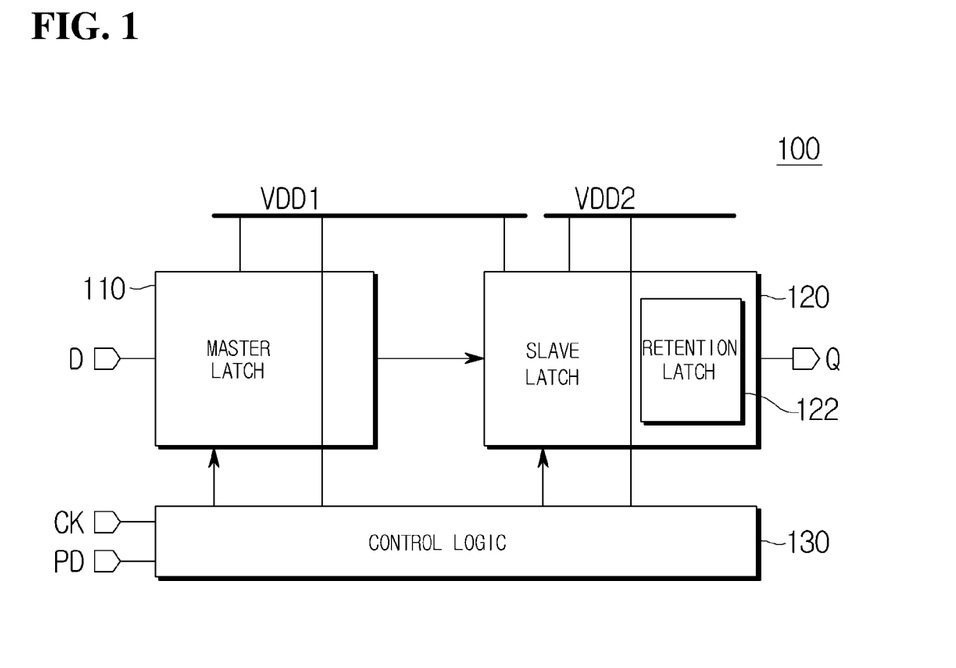
FIG. 1 is a block diagram illustrating an example low-power retention flip-flop, in accordance with one or more embodiments.
Figure 2:
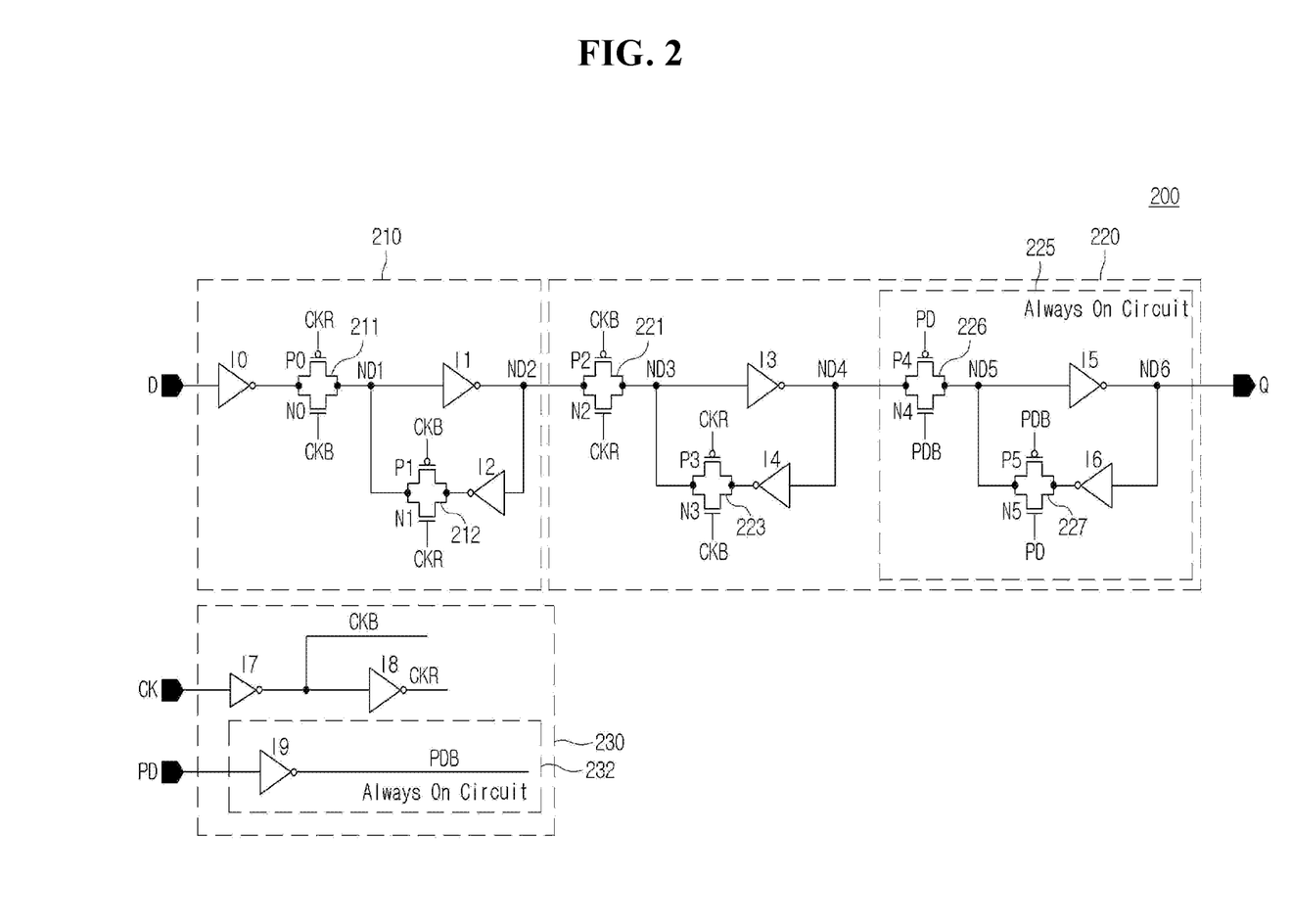
FIG. 2 illustrates a circuit structure of an example low-power retention flip-flop, in accordance with one or more embodiments.

FIG. 1 illustrates a block diagram of an example low-power retention flip-flop 100, in accordance with one or more embodiments. In the examples, detailed structures of the components shown in FIG. 1 will be described with reference to FIG. 2. FIG. 2 illustrates a circuit structure of an example low-power retention flip-flop 200, in accordance with one or more embodiments. The low-power retention flip-flop described in the following examples may be a D flip-flop. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

Referring to FIG. 1, the low-power retention flip-flop 100 may include a master latch 110, a slave latch 120, and a control logic 130.

In one or more examples, the master latch 110 may receive power via a first power source, VDD1, and may store (maintain) or output an input signal D in accordance with first and second clock signals CKB and CKR provided from the control logic 130. In an example, the master latch 110 transfers the input signal D to the slave latch 120 at the rising edge of the clock signal, and holds data at the falling edge of the clock signal, so that the state can be maintained until the next input signal D comes in.

In an example, as illustrated in FIG. 2, the master latches 110 and 210 may include a first inverter (or NOT gate) I0, a first transfer gate 211, a second transfer gate 212, a second inverter I1, and a third inverter I2.

The first transfer gate 211 of the master latches 110 and 210 may include a first PMOS transistor P0 and a first NMOS transistor N0 connected in parallel between an output terminal of the first inverter I0 and a first node ND1. The second transfer gate 212 of the master latches 110 and 210 may include a second PMOS transistor P1 and a second NMOS transistor N1 connected in parallel between the first node ND1 and the third inverter I2. In an example, the first clock signal CKB may be input to a gate of the first NMOS transistor N0 and a gate of the second PMOS transistor P1, and the second clock signal CKR may be input to a gate of the first PMOS transistor P0 and a gate of the second NMOS transistor N1. The first clock signal CKB may be obtained by inverting a clock signal CK, and the second clock signal CKR may be obtained by inverting the first clock signal CKB. The second inverter I1 of the master latches 110 and 210 may be connected to the first node ND1 and a second node ND2. The third inverter I2 may be connected to the second node ND2 and the second transfer gate 212.

In an example, the first inverter I0 of the master latch 110 may output an inverted input signal D. The first transfer gate 211 may output an output signal of the first inverter I0 to the first node ND1 based on the first clock signal CKB and the second clock signal CKR. The second inverter I1 may invert a signal of the first node ND1 and output it to the second node ND2. The third inverter I2 may invert a signal of the second node ND2 and output it to the second transfer gate 212. The second transfer gate 212 may output an output signal of the third inverter I2 to the first node ND1 based on the first clock signal CKB and the second clock signal CKR.

In an example, circuit elements of the master latch 110 and 210, for example, the first inverter I0, the first transfer gate 211, the second transfer gate 212, the second inverter I1, and the third inverter I2, may receive power via the first power source, VDD1 through a first power terminal. The power received via the VDD1 may be supplied only during a normal operation mode, and may be cut off during a power down mode. In an example, the power supplied via the VDD1 may be cut off during the power down mode, so that the circuit elements of the master latch 110 may be powered off during the power down mode. When the power is turned off, data stored by the master latches 110 and 210 may be lost.

In an example, the slave latch 120, 220 may receive power via the first power source (VDD1) and/or a second power source (VDD2). In accordance with the first clock signal CKB, the second clock signal CKR, a power down signal PD, and an inverted power down signal PDB which are provided from the control logic 130, the slave latch 120 may store (or maintain) or output an output signal of the master latch 110. In an example, the slave latch 120 may include a retention latch 122 which stores (or holds) data during the power off mode.

In an example, the circuit elements among some circuit elements included in the slave latch 120, except the retention latch 122, may be supplied with power via the first power source (VDD1). On the other hand, the circuit elements of the retention latch 122 may be supplied with power via the second power source (VDD2) through a second power terminal. The power via the VDD1 may be supplied only during the normal operation mode, and the power supply may be cut off during the power down mode through the first power terminal. The power via the VDD2 may be supplied regardless of whether the flip-flop is in the power down mode through the second power terminal. In an example, a retention latch 225 disposed at an output terminal of the slave latch 120 may always receive power via the VDD2 regardless of whether the flip-flop is in the power down mode, thereby forming a closed loop during the power down mode. The retention latch 225 forms the closed loop during the power down mode, so that the data stored (or held) or captured in the slave latch 120 during the power down mode is maintained.

In an example, as illustrated in FIG. 2, the slave latches 120 and 220 may include a third transfer gate 221, a fourth transfer gate 223, a fourth inverter I3, a fifth inverter I4, and the retention latch 225. The third transfer gate 221 of the slave latches 120 and 220 may include a third PMOS transistor P2 and a third NMOS transistor N2 connected in parallel between an output terminal of the master latch 110 via the second node ND2, and a third node ND3. The fourth transfer gate 223 of the slave latches 120 and 220 may include a fourth PMOS transistor P3 and a fourth NMOS transistor N3 connected in parallel between the third node ND3 and the fifth inverter I4. In an example, the second clock signal CKR may be input to a gate of the third NMOS transistor N2 and a gate of the fourth PMOS transistor P3, and the first clock signal CKB may be input to a gate of the third PMOS transistor P2 and a gate of the fourth NMOS transistor N3.

In an example, the third transfer gate 221 of the slave latches 120 and 220 may output the output signal of the master latches 110 and 210 to the third node ND3 based on the first clock signal CKB and the second clock signal CKR. The fourth inverter I3 may invert the signal of the third node ND3 and output the inverted signal to the fourth node ND4. The fifth inverter I4 may invert the signal of the fourth node ND4 and output the inverted the signal of the fourth node ND4 to the fourth transfer gate 223. The fourth transfer gate 223 may output the output signal of the fifth inverter I4 to the third node ND3 based on the first clock signal CKB and the second clock signal CKR.

In an example, the circuit elements among the circuit elements included in the slave latches 120 and 220, for example, the third transfer gate 221, the fourth transfer gate 223, the fourth inverter I3, and the fifth inverter I4 may receive power via the VDD1, except for the retention latch 225. In an example, the power supply via the VDD1 may be cut off during the power down mode, so that the circuit elements among the circuit elements included in the slave latches 120 and 220, except for the retention latch 225, may be powered off during the power down mode. In an example, the third transfer gate 221, the fourth transfer gate 223, the fourth inverter I3, and the fifth inverter I4 of the slave latches 120 and 220 may be powered off during the power down mode. When the power is turned off, data stored in the third transfer gate 221, the fourth transfer gate 223, the fourth inverter I3, and the fifth inverter I4 of the slave latches 120 and 220 may be lost.

In an example, the retention latch 225 disposed at the output terminal of the slave latch 120 may include a fifth transfer gate 226, a sixth transfer gate 227, a sixth inverter I5, and a seventh inverter I6. The fifth transfer gate 226 may include a fifth PMOS transistor P4 and a fifth NMOS transistor N4 connected in parallel between the output terminal of the master latch 110 and 210, and a fifth node ND5, or between the fourth node ND4 and the fifth node ND5. The sixth transfer gate 227 may include a sixth PMOS transistor P5 and a sixth NMOS transistor N5 connected in parallel between the fifth node ND5 and the seventh inverter I6. In an example, the inverted power down signal PDB may be input to a gate of the fifth NMOS transistor N4, and a gate of the sixth PMOS transistor P5. The power down signal PD may be input to a gate of the fifth PMOS transistor P4 and a gate of the sixth NMOS transistor N5. The power down signal PD may be input from the outside of the low-power retention flip-flops 100 and 200 and may indicate whether the flip-flop is in the power down mode. The inverted power down signal PDB may be obtained by inverting the power down signal PD. The sixth inverter I5 may be connected to the fifth node ND5 and the sixth node ND6, and the seventh inverter I6 may be connected to the sixth node ND6 and the sixth transfer gate 227.

In an example, the fifth transfer gate 226 of the retention latch 225 may output the signal of the fourth node ND4 to the fifth node ND5 based on the power down signal PD and the inverted power down signal PDB. The sixth inverter I5 may invert a signal of the fifth node ND5, and may output the inverted signal to the sixth node ND6, and the seventh inverter I6 may invert a signal received from the sixth node ND6, and may output the inverted signal to the sixth transfer gate 227. The sixth transfer gate 227 may output an output signal of the seventh inverter I6 to the fifth node ND5 based on the power down signal PD and the inverted power down signal PDB.

In an example, the fifth transfer gate 226, the sixth transfer gate 227, the sixth inverter I5, and the seventh inverter I6 included in the retention latches 122 and 225 may always be supplied with power via the VDD2, regardless whether the flip-flop is in the power down mode. Since power may be supplied to all the circuit elements of the low-power retention flip-flops 100 and 200 during the normal operation mode, the retention latches 122 and 225 may operate in an open loop during the normal operation mode. In an example, the retention latches 122 and 225 may transmit the signal received from the fourth node ND4 to an output terminal Q during the normal operation mode. During the power down mode, power is supplied only to some circuit elements of the low-power retention flip-flops 100 and 200. In an example, power may be supplied to the retention latches 122 and 225, and buffers related to the power down mode. Therefore, the retention latch 122 and 225 may form a closed loop during the power down mode to store (or hold) data. The data held or stored during the power down mode may be data obtained by the fifth transfer gate 226 from the fourth node ND4 immediately before the power down mode.

In an example, the control logic 130 may output a signal to control at least one transfer gate included in the master latch 110 and the slave latch 120, based on the clock signal CK and/or the power down signal PD. In an example, the control logics 130 and 230 may include, as illustrated in FIG. 2, an eighth inverter I7, a ninth inverter I8, and a tenth inverter I9.

In an example, the control logics 130 and 230 may invert the clock signal CK input by implementing the eighth inverter I7 and the ninth inverter I8. Then the first clock signal CKB and the second clock signal CKR may be generated as an output to control the transfer gates 211, 212, 221, and 223 included in the low-power retention flip-flops 100 and 200. In an example, the control logic 130 may invert the input clock signal CK by implementing the eighth inverter I7 to output the first clock signal CKB, and may again inverts the first clock signal CKB from the eighth inverter I7, by implementing the ninth inverter I8, thereby outputting the second clock signal CKR. The control logics 130 and 230 may provide the first clock signal CKB and the second clock signal CKR to the transfer gates 211 and 212 of the master latches 110 and 210, and to the transfer gates 221 and 223 of the slave latches 120 and 220.

In an example, the control logics 130 and 230 may output the inverted power down signal PDB based on the input power down signal PD by implementing the tenth inverter I9. The control logics 130 and 230 may output the power down signal PD and the inverted power down clock signal PDB in order to control the transfer gates 226 and 227 of the retention latches 122 and 225 within the slave latches 120 and 220.

In an example, some circuit elements of the control logics 130 and 230 may be connected to the VDD1 and may receive power via the VDD1, and other some circuit elements may be connected to the VDD2 and may receive power via the VDD2. In an example, the circuit elements (e.g., CK-related buffers) related to the clock signal in the control logics 130 and 230 may receive power via the VDD1, and the circuit elements (e.g., PD-related buffers)

related to the power down signal may receive power via the VDD2. In an example, the eighth inverter I7 and the ninth inverter I8, which are CK-related buffers within the control logics 130 and 230, may receive power and operate normally during the normal operation mode, and may be powered off due to a power down during the power down mode. The tenth inverter I9 that is a PD-related buffer within the control logics 130 and 230 may always receive power and may operate normally regardless of whether the flip-flop is in the normal operation mode or in the power down mode. In an example, the tenth inverter I9 may provide the power down signal PD and the inverted power down signal PDB to the retention latches 122 and 225 regardless of whether the flip-flop is in the power down mode.

As described above, in the low-power retention flip-flops 100 and 200 in various examples, power may be supplied to the retention latch 122 and the PD-related buffer even during the power down mode, so that the data immediately before the power is cut off can be stored (or held) through the retention latch 122 which operates based on the power down signal and the inverted power down signal while the power is cut off.

Typically, in a data storage circuit such as a flip-flop, in order to prevent circuit malfunction, an initial state may be set to a specific value by receiving an external reset and/or set signal. Accordingly, various examples disclose a circuit structure of the low-power retention flip-flop having a reset function and/or a set function that sets an initial state to a specific value.

Figure 3:
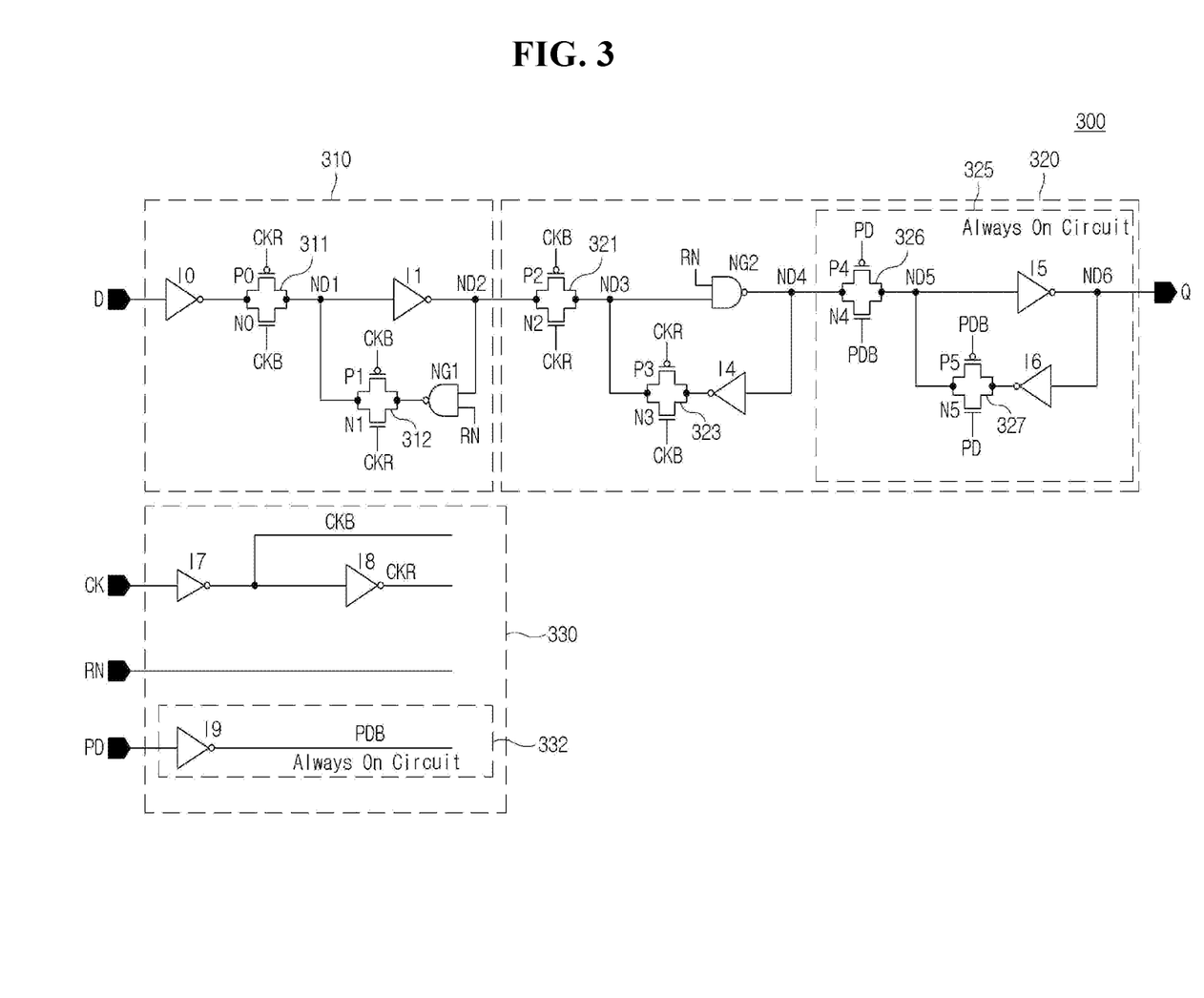
FIG. 3 illustrates a circuit structure of an example low-power retention flip-flop with a reset function, in accordance with one or more embodiments.

FIG. 3 illustrates a circuit structure of an example low-power retention flip-flop 300 which has a reset function, in accordance with one or more embodiments. FIG. 3 illustrates an example low-power retention flip-flop 100 illustrated in FIG. 1, and a reset function (or a negative reset function) is added to the circuit structure.

Referring to FIG. 3, the low-power retention flip-flop 300 may include a master latch 310, a slave latch 320, and a control logic 330. The master latch 310, the slave latch 320, and the control logic 330 may respectively correspond to the master latch 110, the slave latch 120, and the control logic 130 of FIG. 1.

In one or more examples, the master latch 310 may receive power via the VDD1 and may store (or hold) or output the input signal D in accordance with the first and second clock signals CKB and CKR provided from the control logic 330. In an example, the master latch 310 may receive a reset signal RN provided from the control logic 330 in order to set an initial state to a specific value.

In an example, as illustrated in FIG. 3, the master latch 310 may include the first inverter I0, a first transfer gate 311, a second transfer gate 312, the second inverter I1, and a first NAND gate NG1. The master latch 310 illustrated in FIG. 3 is different from the master latch 210 of FIG. 2 in that the master latch 310 includes the NAND gate NG1 instead of an inverter between the second node ND2 and the second transfer gate 312. The other components of the master latch 310 may be the same as those of the master latch 210 of FIG. 2. The first NAND gate NG1 of the master latch 310 may perform a negative OR operation on the reset signal RN and the signal of the second node ND2, and may output the result of the operation. The reset signal may be input in order to prevent circuit malfunction by setting the initial state of the low-power retention flip-flop 300 to a specific value. In an example, when the reset signal RN is at a high level, the output of the first NAND gate NG1 may vary according to the signal of the second node ND2. When the reset signal RN is at a low level, the first NAND gate NG1 may output a high-level signal by the reset signal RN regardless of the signal of the second node ND2. Here, since the structure and operation of the master latch 310 without the first NAND gate NG1 are the same as those of the master latch 210 of FIG. 2, descriptions thereof will be omitted.

In an example, as illustrated in FIG. 3, the slave latch 320 may include a third transfer gate 321, a fourth transfer gate 323, a second NAND gate NG2, the fifth inverter I4, and a retention latch 325. The slave latch 320 is different from the slave latch 220 of FIG. 2 in that the slave latch 320 includes the second NAND gate NG2 instead of an inverter between the third node ND3 and the fourth node ND4. The other components of the slave latch 320 may be the same as those of the slave latch 220 of FIG. 2. In an example, the configuration of the retention latch 325 of FIG. 3 may be the same as that of the retention latch 225 of FIG. 2. The second NAND gate NG2 of the slave latch 320 may perform a negative OR operation on the reset signal RN and the signal of the third node ND3, and may output the result. When the reset signal RN is at a high level, the output of the second NAND gate NG2 may vary depending on the signal of the third node ND3. When the reset signal RN is at a low level, the second NAND gate NG2 may output a high-level signal by the reset signal RN, regardless of the output signal of the third node ND3. In an example, since the structure and operation of the slave latch 320 other than the second NAND gate NG2 may be the same as those of the slave latch 220 of FIG. 2, descriptions thereof will be omitted.

In one or more examples, the control logic 330 may output a signal to control at least one transfer gate included in the master latch 310 and the slave latch 320, based on the clock signal CK and/or the power down signal PD. In an example, the control logic 330 may output the reset signal RN to set the initial states of the master latch 310 and the slave latch 320 to a specific value.

In an example, as illustrated in FIG. 3, the control logic 330 may include the eighth inverter I7, the ninth inverter I8, and the tenth inverter I9. In an example, the connection relationship and/or operation of the buffers I7 and I8 related to the clock signal and the PD-related buffer I9 may be the same as those described with reference to FIG. 2. In an example, the control logic 330 may be different from the control logic 230 of FIG. 2 only in that the control logic 330 may receive the reset signal and output the reset signal to the master latch 310 and the slave latch 320, and other structures and/or operations of the control logic 330 may be the same as those of the control logic 230 of FIG. 2, descriptions thereof will be omitted. In an example, the reset signal may be a negative reset signal which is at a high level when no reset event occurs and is at a low level when a reset event occurs.

As described above, in the low-power retention flip-flop 300 according to various examples, the output terminal Q of the slave latch may be set to 1′b0 based on the reset signal.

Figure 4:
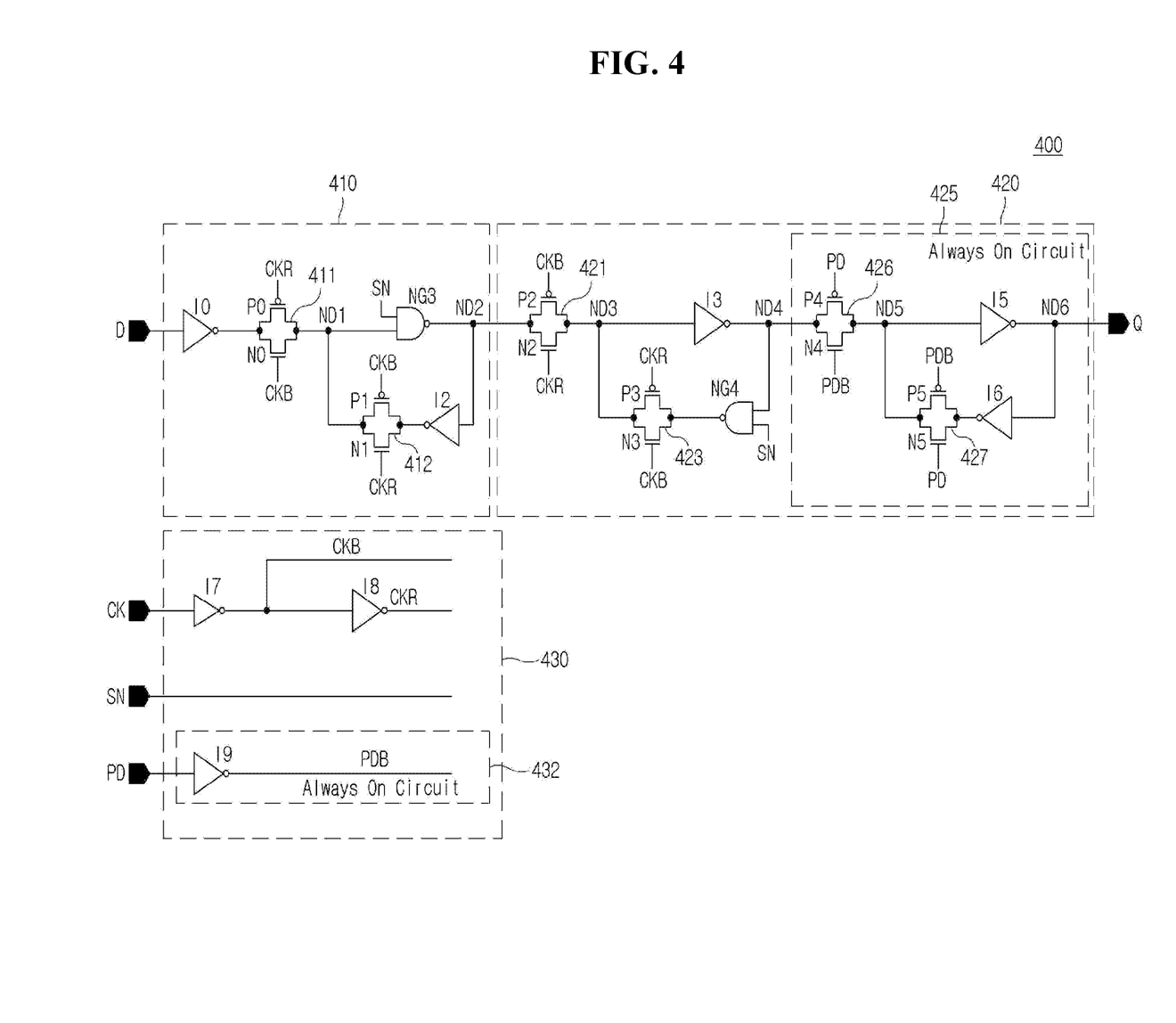
FIG. 4 illustrates a circuit structure of an example low-power retention flip-flop with a set function, in accordance with one or more embodiments.

FIG. 4 illustrates a circuit structure of an example low-power retention flip-flop 400 which has a set function in accordance with one or more examples. FIG. 4 illustrates an example of the low-power retention flip-flop 100 shown in FIG. 1, and a set function (or a negative set function) is added to the circuit structure.

Referring to FIG. 4, the example low-power retention flip-flop 400 may include a master latch 410, a slave latch 420, and a control logic 430. The master latch 410, the slave latch 420, and the control logic 430 may respectively correspond to the master latch 110, the slave latch 120, and the control logic 130 of FIG. 1.

In one or more examples, the master latch 410 may receive power via the VDD1 and may store (or hold) or output the input signal D in accordance with the first and second clock signals CKB and CKR provided from the control logic 430. In an example, the master latch 410 may receive a set signal SN provided from the control logic 430 in order to set an initial state to a specific value.

In an example, as illustrated in FIG. 4, the master latch 410 may include the first inverter I0, a first transfer gate 411, a second transfer gate 412, and a third NAND gate NG3, and the third inverter I2. The master latch 410 illustrated in FIG. 4 may be different from the master latch 210 of FIG. 2 in that the master latch 410 includes the third NAND gate NG3 instead of an inverter between the first node ND1 and the second node ND2. The other components of the master latch 410 may be the same as those of the master latch 210 of FIG. 2. The third NAND gate NG3 of the master latch 410 may perform a negative OR operation on the set signal SN and the signal of the first node ND1, and may output the result of the operation. The set signal may be input in order to prevent circuit malfunction by setting the initial state of the low-power retention flip-flop 400 to a specific value. When the set signal SN is at a high level, the output of the third NAND gate NG3 may vary according to the signal of the first node ND1. When the set signal SN is at a low level, the third NAND gate NG3 may output a high-level signal by the set signal SN regardless of the signal of the first node ND1. In an example, since the structure and operation of the master latch 410 without the third NAND gate NG3 may be the same as those of the master latch 210 of FIG. 2, descriptions thereof will be omitted.

In an example, as illustrated in FIG. 4, the slave latch 420 may include a third transfer gate 421, a fourth transfer gate 423, the fourth inverter I3, a fourth NAND gate NG4, and a retention latch 425. The slave latch 420 may be different from the slave latch 220 of FIG. 2 in that the slave latch 420 may include the fourth NAND gate NG4 instead of an inverter between the fourth node ND4 and the fourth transfer gate 423. The other components of the slave latch 420 may be the same as those of the slave latch 220 of FIG. 2. In an example, the configuration of the retention latch 425 of FIG. 4 may be the same as that of the retention latch 225 of FIG. 2. The fourth NAND gate NG4 of the slave latch 420 may perform a negative OR operation on the set signal SN and the signal of the fourth node ND4 and may output the result. When the set signal SN is at a high level, the output of the fourth NAND gate NG4 may vary depending on the signal of the fourth node ND4. When the set signal SN is at a low level, the fourth NAND gate NG4 may output a high-level signal by the set signal SN, regardless of the output signal of the fourth node ND4. In an example, since the structure and operation of the slave latch 420 other than the fourth NAND gate NG4 may be the same as those of the slave latch 220 of FIG. 2, descriptions thereof will be omitted.

In one or more examples, the control logic 430 may output a signal to control at least one transfer gate included in the master latch 410 and the slave latch 420, based on the clock signal CK and/or the power down signal PD. In an example, the control logic 430 may output the set signal SN to set the initial states of the master latch 410 and the slave latch 420 to a specific value.

In an example, as illustrated in FIG. 4, the control logic 430 may include the eighth inverter I7, the ninth inverter I8, and the tenth inverter I9. In an example, the connection relationship and/or operation of the buffers I7 and I8 related to the clock signal and the PD-related buffer I9 may be the same as those described with reference to FIG. 2. In an example, the control logic 430 may be different from the control logic 230 of FIG. 2 only in that the control logic 430 may receive the set signal and output the set signal to the master latch 410 and the slave latch 420, and other structures and/or operations of the control logic 330 may be the same as those of the control logic 230 of FIG. 2, descriptions thereof will be omitted. In an example, the set signal may be a negative set signal which is at a high level when no set event occurs and is at a low level when a set event occurs.

As described above, in the low-power retention flip-flop in accordance with one or more examples, the output terminal Q of the slave latch may be set to 1'b1 based on the set signal.

Figure 5:
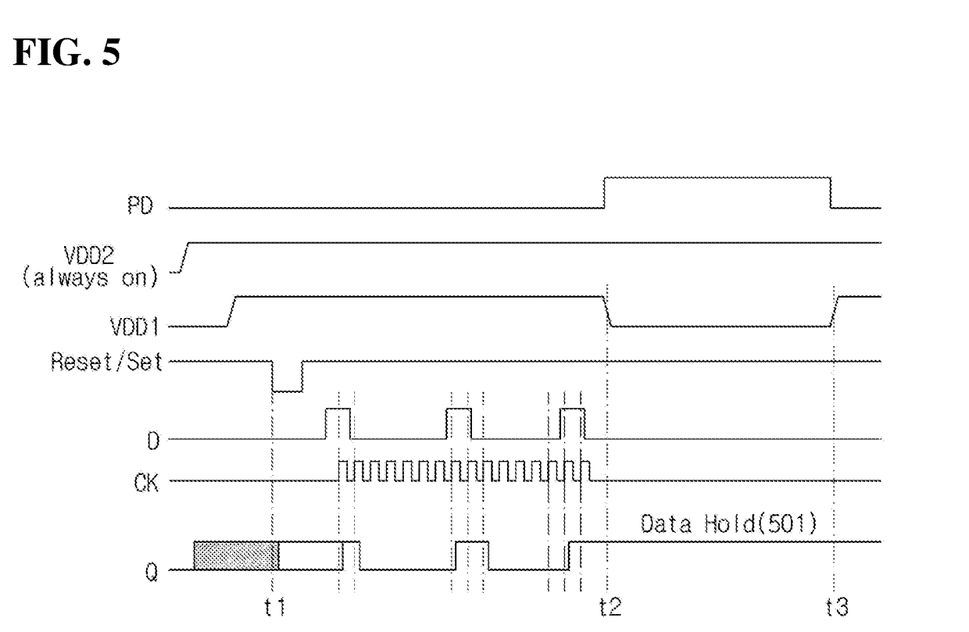
FIG. 5 illustrates a diagram of operations of an example low-power retention flip-flop, in accordance with one or more embodiments.

FIG. 5 is a diagram illustrating operations of an example low-power retention flip-flop, in accordance with one or more embodiments. In an example, a low-power retention flip-flop having the reset function illustrated in FIG. 3 will be described as an example. However, the embodiment described below may be, as shown in FIG. 4, applied in the same manner to a low-power retention flip-flop having the set function.

As illustrated in FIG. 5, when power is supplied through the VDD2 in the low-power retention flip-flop, and the low-level power down signal PD indicating a normal operation mode is applied, the power may be supplied through the VDD1 (connected to the VDD2) through a power down switch array (PD switch array). Accordingly, the master latch 310 and the slave latch 320 of the low-power retention flip-flop may be able to operate in the normal operation mode. A value of an output Q may be randomly determined by a race condition based on input/output of a feedback loop of the slave latch 320 until the negative reset signal RN (Reset) is input.

In an example, when the negative reset signal RN is input at a first time point t1, the output Q may be 1'b0 at a negative edge (or a falling edge). Then, the low-power retention flip-flop may operate in the normal operation mode.

Then, for switching to the idle and/or sleep mode, when the high-level power down signal PD is input at a second time point t2, power may be continuously supplied to the retention latch 325 and the buffer (e.g., the tenth inverter I9) related to the power down signal. Power supply may be cut off to other circuits. Accordingly, the circuit elements of the retention latch 325 provided at the output terminal of the slave latch 320 form a closed loop, so that the data can be held (Data Hold, 501) immediately before the power down signal.

Then, for switching to the normal operation mode, when the low-level power down signal PD is input at a third time point t3, the data held in the retention latch 325 of the slave latch 320 is transmitted to the output terminal. Accordingly, the data immediately before being switched to the power down mode can be recovered.

As described above, the operation of the low-power retention flip-flop 300 having the reset function may be shown in Table 1 below.

TABLE 1

| PD | RN | D | CK | Q | Mode |
|---|---|---|---|---|---|
| 0 | 0 | X | X | 0 | Reset |
| 0 | 1 | 0 | ↑ | 0 | Normal Operation |
| 0 | 1 | 1 | ↑ | 1 | Normal Operation |
| 0 | 1 | X | ↓ | Q | Data Hold |
| 0->1 | X | X | X | Q | Data Hold (Power Down) |
| 1->0 | X | X | X | Q | Data Hold (Power Up) |

As illustrated in Table 1, the low-power retention flip-flop 300 may perform a reset mode before operating in a normal operation mode. In this example, as the low-level reset signal RN is input, the value of the output terminal Q of the slave latch 320 may become 0. Then, as the low-power retention flip-flop operates in the normal operation mode, a signal corresponding to the input signal D may be output to the output terminal Q at the rising edge "↑" of the clock signal CK.

Then, for switching to the power down mode from the normal operation mode, when the power down signal PD is switched from a low level to a high level (0→1), the slave latch 320 can hold data within the slave latch 320 immediately before the power down signal is input (Data Hold). Here, the retention latch 325 provided at the output terminal of the slave latch 320 may form a closed loop and hold the data.

When the power down signal PD is switched from a high level to a low level (1→0) in order to switch from the power down mode to the normal operation mode, the data previously held in the retention latch 325 may be output to the output terminal, until the data which is input to an input terminal of the master latch 310 is transmitted to the retention latch 325 of the slave latch 320.

As described above, the operation of the low-power retention flip-flop shown in FIG. 5 may be applied in the same manner to a low-power retention flip-flop 400 having the set function as illustrated in FIG. 4. The operation of the low-power retention flip-flop 400 having the set function may be shown in Table 2 below.

TABLE 2

| PD | SN | D | CK | Q | Mode |
|---|---|---|---|---|---|
| 0 | 0 | X | X | 1 | set |
| 0 | 1 | 0 | ↑ | 0 | Normal Operation |
| 0 | 1 | 1 | ↑ | 1 | Normal Operation |
| 0 | 1 | X | ↓ | Q | Data Hold |
| 0->1 | X | X | X | Q | Data Hold (Power Down) |
| 1->0 | X | X | X | Q | Data Hold (Power Up) |

As illustrated in Table 2, the low-power retention flip-flop 400 may perform a set mode before operating in the normal operation mode. In order to perform the set mode, as the low-level set signal SN is input, the value of the output terminal Q of the slave latch 420 may become 1. After performing the set mode, the low-power retention flip-flop 400 may operate in the normal operation mode. Accordingly, a signal corresponding to the input signal D may be output to the output terminal Q at the rising edge "↑" of the clock signal CK.

For switching to the power down mode from the normal operation mode, when the power down signal PD is switched from a low level to a high level (0→1), the slave latch 420 can hold the data within the slave latch 320 immediately before the power down signal is input (Data Hold). In an example, the retention latch 325 provided at the output terminal of the slave latch 320 may form a closed loop and hold the data.

When the power down signal PD is switched from a high level to a low level (1→0) in order to switch from the power down mode to the normal operation mode, the data previously held in the retention latch 325 may be output to the output terminal, until a data is transmitted to the retention latch 425 of the slave latch 420.

Figure 6A:
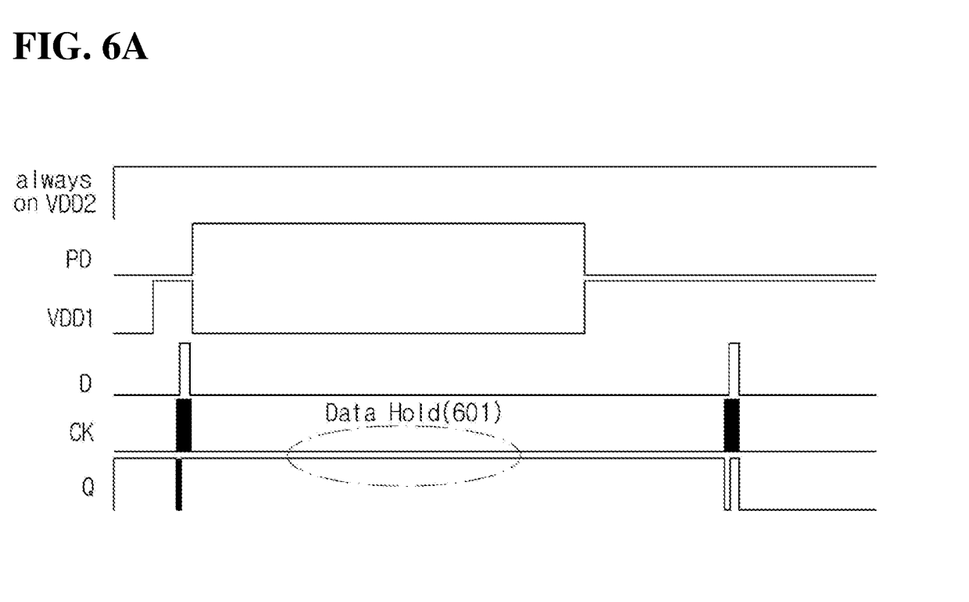
FIGS. 6A, 6B, and 6C illustrate simulation results of the operation of an example low-power retention flip-flop, in accordance with one or more embodiments.
Figure 6B:
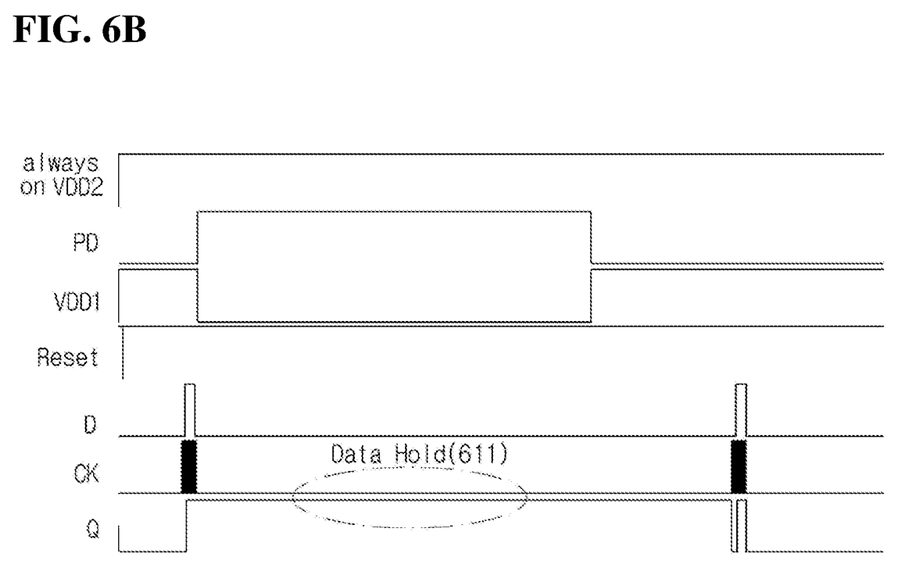
Figure 6C:
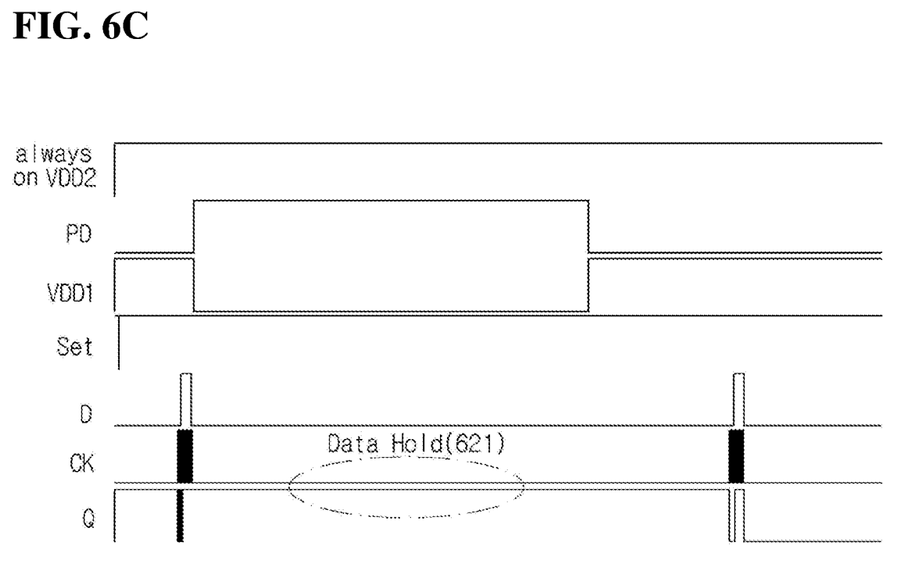

FIGS. 6A, 6B and 6C illustrate simulation results of the operation of the low-power retention flip-flop, in accordance with one or more embodiments. FIG. 6A illustrates a simulation result of the operation of the low-power retention flip-flop 200 illustrated in FIG. 2, and FIG. 6B illustrates a simulation result of the operation of the example low-power retention flip-flop 300 shown in FIG. 3. FIG. 6C illustrates a simulation result of the operation of the example low-power retention flip-flop 400 illustrated in FIG. 4.

Referring to FIGS. 6A, 6B and 6C, in the example low-power retention flip-flops 200, 300, and 400 in accordance with one or more embodiments, the data immediately before being switched to the power down mode can be output as they are when being switched to the normal operation mode. The data immediately before being switched to the power down mode are held (601, 611, and 621) during the power down mode by using the retention latches 225, 325 and 425 provided at the output terminals of the slave latches 220, 320, and 420.

The apparatuses, units, modules, devices, and other components described herein and with respect to FIGS. 1, 2, 3, 4, 5, 6A, 6B and 6C, are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods that perform the operations described in this application and illustrated in FIGS. 1-6C are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller, e.g., as respective operations of processor implemented methods. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computers using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. A retention flip-flop comprising:
a master latch configured to output a first signal generated based on a signal received from an input terminal of the master latch according to first control signals;
a slave latch comprising a retention latch, wherein the retention latch is connected directly to an output terminal of the slave latch and is configured to output a second signal generated based on the first signal input from the master latch according to the first control signals and second control signals; and
a control logic configured to: generate the first control signals based on a clock signal and provide the generated first control signals to the master latch and the slave latch, and generate the second control signals based on a power down signal and provide the generated second control signals to the slave latch,
wherein the retention latch is configured to: transmit the first signal to the output terminal as the second signal by operating as an open loop according to the second control signals during a normal operation mode, and maintain the second signal by forming a closed loop according to the second control signals during a power down mode,
wherein the slave latch comprises first circuit elements configured to: transmit the first signal inputted from the master latch to the retention latch according to the first control signals during the normal operation mode, and be powered off during the power down mode,
wherein the first circuit elements comprise:
a first transfer gate connected between an output terminal of the master latch and a first node, the first transfer gate comprising NMOS and PMOS transistors and configured to output the first signal inputted from the master latch to the first node according to the first control signals;

a first inverter connected between the first node and a second node, and configured to invert a signal of the first node and output a first inverted signal to the second node;

a second inverter configured to invert the first inverted signal of the second node and output a second inverted signal; and a second transfer gate connected between the second inverter and the first node, the second transfer gate comprising NMOS and PMOS transistors and configured to output the second inverted signal to the first node according to the first control signals, and wherein the retention latch is connected between the second node and the output terminal of the slave latch.

2. The retention flip-flop of claim 1, wherein the master latch and the first circuit elements in the slave latch are configured to be powered off during the power down mode, and wherein the retention latch is configured to maintain a power-on state during the power down mode.

3. The retention flip-flop of claim 2, further comprising:

a first power terminal configured to supply or cut off power based on the power down mode; and a second power terminal configured to always supply power regardless of the power down mode, wherein the first power terminal is connected to the master latch, the first circuit elements in the slave latch, and second circuit elements related to the first control signals in the control logic, and wherein the second power terminal is connected to the retention latch and third circuit elements related to the second control signals in the control logic.

4. The retention flip-flop of claim 1, wherein the control logic comprises an inverter configured to invert the power down signal and output an inverted power down signal, and wherein the second control signals comprise the power down signal and the inverted power down signal.

5. The retention flip-flop of claim 4, wherein the inverter is configured to maintain a power-on state during the power down mode.

6. The retention flip-flop of claim 1, wherein the retention latch comprises:

a third transfer gate which is connected between the second node and a third node, the third transfer gate comprising an NMOS transistor and a PMOS transistor, and configured to output the first inverted signal of the second node to the third node according to the second control signals;

a third inverter which is connected between the third node and a fourth node, and is configured to invert a signal of the third node, and output a third inverted signal to the fourth node;

a fourth inverter configured to invert the third inverted signal of the fourth node, and output a fourth inverted signal; and a fourth transfer gate which is connected between the fourth inverter and the third node, the fourth transfer gate comprising an NMOS transistor and a PMOS transistor, and configured to output the fourth inverted signal of the fourth inverter to the third node according to the second control signals.

7. The retention flip-flop of claim 1, wherein the control logic is configured to receive a reset signal, and output the received reset signal to the master latch and the slave latch, respectively, and wherein each of the master latch and the slave latch comprises a NAND gate which is configured to perform a negative OR operation on the reset signal and a signal of a node within each of the latches, and set an initial state value based on the reset signal.

8. The retention flip-flop of claim 1, wherein the control logic is configured to receive a set signal and output the set signal to the master latch and the slave latch, respectively, and wherein each of the master latch and the slave latch comprises a NAND gate which is configured to perform a negative OR operation on the set signal and a signal of a node within each of the latches, and set an initial state value based on the set signal.

9. A retention flip-flop comprising:

a first power terminal configured to supply or cut off power based on a power down mode;

a second power terminal configured to always supply power regardless of the power down mode;

a master latch connected to the first power terminal, and configured to output a first signal which is generated based on a signal received from an input terminal of the master latch according to first control signals;

a slave latch comprising a retention latch, wherein the retention latch is connected directly to an output terminal of the slave latch, connected to the first power terminal and the second power terminal, and configured to output a second signal which is generated based on the first signal input from the master latch according to the first control signals and second control signals; and a control logic connected to the first power terminal and the second power terminal, and configured to: generate the first control signals based on a clock signal, and provide the generated first control signals to the master latch and the slave latch, and generate the second control signals based on a power down signal and provide the generated second control signals to the slave latch, wherein the retention latch is connected to the second power terminal and is configured to operate as any one of an open loop or a closed loop according to the second control signals, and wherein the retention latch is further configured to: transmit the first signal to the output terminal as the second signal by operating as the open loop according to the second control signals during a normal operation mode, and maintain the second signal by forming the closed loop according to the second control signals during the power down mode, wherein the slave latch comprises first circuit elements connected to the first power terminal and configured to: transmit the first signal inputted from the master latch to the retention latch according to the first control signals during the normal operation mode and be powered off during the power down mode, wherein the first circuit elements comprise:

a first transfer gate connected between an output terminal of the master latch and a first node, the first transfer gate comprising NMOS and PMOS transistors and configured to output the first signal inputted from the master latch to the first node according to the first control signals;

a first inverter connected between the first node and a second node, and configured to invert a signal of the first node and output a first inverted signal to the second node;

a second inverter configured to invert the first inverted signal of the second node and output a second inverted signal; and a second transfer gate connected between the second inverter and the first node, the second transfer gate comprising NMOS and PMOS transistors and configured to output the second inverted signal to the first node according to the first control signals, and wherein the retention latch is connected between the second node and the output terminal of the slave latch.

10. The retention flip-flop of claim 9, wherein the master latch and the first circuit elements in the slave latch are configured to be powered off during the power down mode, and wherein the retention latch is configured to maintain a power-on state during the power down mode.

11. The retention flip-flop of claim 10, wherein circuit elements related to the first control signals in the control logic are connected to the first power terminal, and circuit elements related to the second control signals in the control logic are connected to the second power terminal.

12. The retention flip-flop of claim 11, wherein the control logic comprises an inverter which is connected to the second power terminal, wherein the inverter is configured to invert the power down signal, and output an inverted power down signal, and wherein the second control signals comprise the power down signal and the inverted power down signal.

13. The retention flip-flop of claim 9, wherein the retention latch comprises:

a third transfer gate which is connected between the second node and a third node, the third transfer gate comprising an NMOS transistor and a PMOS transistor, and configured to output the first inverted signal of the second node to the third node according to the second control signals;

a third inverter connected between the third node and a fourth node, and configured to invert a signal of the third node, and output a third inverted signal to the fourth node;

a fourth inverter configured to invert the third inverted signal of the fourth node and output a fourth inverted the signal; and a fourth transfer gate which is connected between the fourth inverter and the third node, the fourth transfer gate comprising an NMOS transistor and a PMOS transistor, and configured to output the fourth inverted signal of the fourth inverter to the third node according to the second control signals.

14. The retention flip-flop of claim 9, wherein the control logic is configured to receive a reset signal and output the received reset signal to the master latch and the slave latch, respectively, and wherein each of the master latch and the slave latch comprises a NAND gate which is configured to perform a negative OR operation on the reset signal and a signal of a node within each of the latches, and sets an initial state value based on the reset signal.

15. The retention flip-flop of claim 9, wherein the control logic is configured to receive a set signal and output the set signal to the master latch and the slave latch, respectively, and wherein each of the master latch and the slave latch comprises a NAND gate which is configured to perform a negative OR operation on the set signal a signal of a node within each of the latches, and sets an initial state value based on the set signal.

16. A flip-flop, comprising:

a master latch configured to receive power from a first power source during a normal operation mode and output a first signal generated based on a signal received from an input terminal of the master latch according to first control signals;

a slave latch comprising a retention latch, wherein the retention latch is connected directly to an output terminal of the slave latch, configured to receive power from the first power source and a second power source, and output a second signal generated based on the first signal input from the master latch according to the first control signals and second control signals, and wherein the retention latch is disposed in the slave latch and is configured to receive power from the second power source, operate in an open loop during the normal operation mode, and operate in a closed loop to store data during a power down mode; and a control logic configured to provide the first control signals and the second control signals to control circuit elements in the master latch and the slave latch, wherein the retention latch is configured to: transmit the first signal to the output terminal as the second signal by operating as the open loop according to the second control signals during the normal operation mode, and maintain the second signal by forming the closed loop according to the second control signals during the power down mode, wherein the slave latch comprises first circuit elements configured to transmit the first signal inputted from the master latch to the retention latch according to the first control signals during the normal operation mode and be powered off during the power down mode, wherein the first circuit elements comprise:

a first transfer gate connected between an output terminal of the master latch and a first node, the first transfer gate comprising NMOS and PMOS transistors and configured to output the first signal inputted from the master latch to the first node according to the first control signals;

a first inverter connected between the first node and a second node, and configured to invert a signal of the first node and output a first inverted signal to the second node;

a second inverter configured to invert the first inverted signal of the second node and output a second inverted signal; and a second transfer gate connected between the second inverter and the first node, the second transfer gate comprising NMOS and PMOS transistors and configured to output the second inverted signal to the first node according to the first control signals, and wherein the retention latch is connected between the second node and the output terminal of the slave latch.

17. The flip-flop of claim 16, wherein the retention latch is configured to operate in an always-on state.

18. The flip-flop of claim 16, wherein the control logic is configured to:

generate the first control signals based on a clock signal and provide the generated first control signals to the master latch and the slave latch, and generate the second control signals based on a power down signal and provide the generated second control signals to the slave latch.

* * * * *